United States Patent [19]

Niinou

[11] Patent Number: 5,398,165
[45] Date of Patent: Mar. 14, 1995

[54] ELECTRONIC CIRCUIT COMPONENT AND MOUNTING METHOD THEREFOR

[75] Inventor: Koichi Niinou, Kyoto, Japan
[73] Assignee: Rohm Co., Ltd., Kyoto, Japan
[21] Appl. No.: 56,658
[22] Filed: May 3, 1993
[30] Foreign Application Priority Data
Aug. 31, 1992 [JP] Japan .................. 4-257288
[51] Int. Cl.6 .................................. H01R 9/00
[52] U.S. Cl. .................. 361/774; 361/748;
361/761; 361/776; 228/180.1; 257/692;
257/696; 439/75
[58] Field of Search ............... 361/736, 743, 748, 756,
361/761, 773, 774, 796, 778, 776; 228/180.1;
257/692, 690, 697, 695, 696; 439/68, 70, 75

[56] References Cited
U.S. PATENT DOCUMENTS

| | | | |
|---|---|---|---|
| 3,604,836 | 9/1971 | Pierpont | 174/52 PE |
| 4,246,627 | 1/1981 | Poensgen | 361/405 |
| 4,373,655 | 2/1983 | McKenzie, Jr. | 228/180 R |
| 5,166,570 | 11/1992 | Takahashi | 310/320 |

OTHER PUBLICATIONS

IBM Technical Disclosure Bulletin, Pin with Taper to form Stand-Off and Slot for Solder Flow. Brownell et al, vol. 26, No. 5, Oct./1983 p. 2656.
IBM, Standoff or Microminature Circuit, Stricker et, vol. 6, No. 3 Aug./1963, p. 15.

*Primary Examiner*—Leo P. Picard
*Assistant Examiner*—Young Whang
*Attorney, Agent, or Firm*—Brumbaugh, Graves, Donohue & Raymond

[57] ABSTRACT

To prevent the lead terminals of an electronic circuit component from being bent due to the vibration of the component after being mounted on a circuit board, each lead terminal has a tapered portion formed between an inserted tip portion and a cut dumb bar portion and having a width which decreases from the dumb bar portion toward the tip portion to prevent stresses from concentrating in the terminal.

3 Claims, 2 Drawing Sheets

ELECTRONIC CIRCUIT COMPONENT AND MOUNTING METHOD THEREFOR

BACKGROUND OF THE INVENTION

This invention relates to lead terminal arrangements for electronic circuit components such as semiconductor devices and to methods of mounting such components.

The arrangement of a lead terminal 3 of a conventional electronic circuit component 1 such as a semiconductor device is described herein with reference to FIG. 4. The component 1 has a package body 2 encapsulating a semiconductor element or the like and lead terminals 3 extending out of the package body. Each of the lead terminals 3 has an inserted tip portion 3a, a cut dumb bar portion 3b and a butt portion 3c. The tip portion 3a is inserted into a lead terminal hole 11 in a printed circuit board 10 when the component 1 is to be mounted thereon. The tip portion 3a has a width which is selected to be smaller than the diameter of the hole 11. The cut dumb bar portion 3b is formed as a result of punching out a dumb bar coupling between the terminals 3 which is provided to hold the terminals together before the package body 2 is molded. The width of the cut dumb bar portion 3b is designed to be larger than the diameter of the lead terminal hole 11 so as to provide a gap between the bottom of the package body 2 and the top of the circuit board 10 when the component 1 is mounted thereon. The width of the butt portion 3c is designed to be larger than that of the inserted tip portion 3a so that the terminal 3 has enough strength at the butt portion. After the component 1 is mounted on the printed circuit board 10, the lead terminals 3 are connected to the bottom of the board by solder 12 using a flow-soldering process or the like. During that process, a soldering flux vaporizes so that the gas therefrom is released to the outside through the lead terminal holes 11 and through the gap between the top of the circuit board 10 and the bottom of the package body 2. Thus, the gap is provided to permit release of the vaporized flux from the top of the circuit board 10 to the outside.

The conventional electronic circuit component 1 has the problem described hereinafter. Since the lead terminal 3 is connected at its tip portion 3a only to the bottom of the printed circuit board 10 by the solder 12, the component is likely to vibrate when the board is vibrated. Because of the vibration of the component, the lead terminal 3 undergoes stress which is likely to concentrate at the boundary A between the tip portion 3a and the cut dumb bar portion 3b of the terminal, at which the width of the terminal changes sharply. For that reason, the lead terminal 3 is likely to undergo metal fatigue at the boundary A so as to be bent or broken.

SUMMARY OF THE INVENTION

Accordingly, it is an object of the present invention to provide an electronic circuit component which overcomes the disadvantages of the prior art.

A further object of the invention is to provide an electronic circuit component having lead terminals which are less likely to be bent or broken due to the vibration of the component after it is mounted.

Another object of the invention is to provide a method of mounting an electronic circuit component so that it is less likely to be vibrated or to be broken as a result of vibration.

These and other objects of the invention are attained by providing an electronic circuit component having lead terminals formed with a tip portion to be inserted into a lead terminal hole in a circuit board, a cut dumb bar portion produced as a result of cutting out a dumb bar that joins the terminals together and having a width larger than the diameter of the terminal hole, and a butt portion wider than the tip portion. Each of the lead terminals also includes a tapered portion joining the tip portion and the cut dumb bar portion and having a width which decreases from the dumb bar portion toward the tip portion.

Thus, an electronic circuit component provided in accordance with the present invention has lead terminals, each of which includes a tapered portion, and an upper end at the cut dumb bar portion of the terminal which is larger than the diameter of the lead terminal hole of a circuit board.

In accordance with another aspect of the present invention, an electronic circuit component having lead terminals, each of which includes a tip portion for insertion into a terminal hole in a circuit board, a cut dumb bar portion formed by cutting out a dumb bar coupling between adjacent terminals so as to make the width of the bar portion larger than the diameter of the terminal hole, a butt portion between the component and the cut dumb bar portion which is wider than the tip portion, and a tapered portion at the boundary between the tip portion and the cut dumb bar portion so that the width of the tapered portion at the upper end thereof on the bar portion is larger than the diameter of the terminal hole, the component being mounted on the circuit board with the tapered portions of the terminals engaging the edge of the board around the terminal holes so that the component is fixed to the board.

In an electronic circuit component made in accordance with the present invention, each of the lead terminals includes a tapered portion formed at the boundary between the inserted tip portion and the cut dumb bar portion and having the width decreasing from the dumb bar portion toward the tip portion so that sharp changes in the width of the terminal are avoided to prevent stress from concentrating in the terminal when the component mounted on the circuit board is vibrated due to the vibration of the board.

Moreover, in accordance with the present invention, a tapered portion may be formed in each of the lead terminals at the boundary between the inserted tip portion and the cut dumb bar portion so that the width of the tapered portion at the upper end thereof on the bar portion is larger than the diameter of the lead terminal hole of the circuit board. With that arrangement, when the lead terminal is inserted into the hole, an intermediate part of the tapered portion engages the edge of the board around the hole so that the component is fixed to the board. As a result, the component is prevented from tilting when it is mounted on the board and from being vibrated after mounting.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
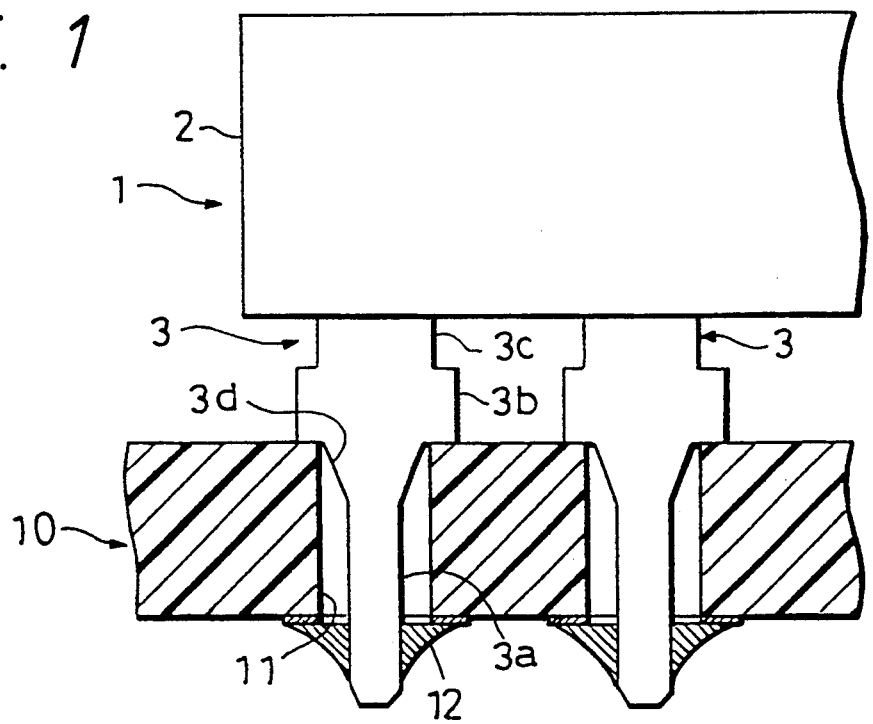
FIG. 1 is a sectional view illustrating the arrangement of lead terminals of an electronic circuit component in one representative embodiment of the present invention.
Figure 4:
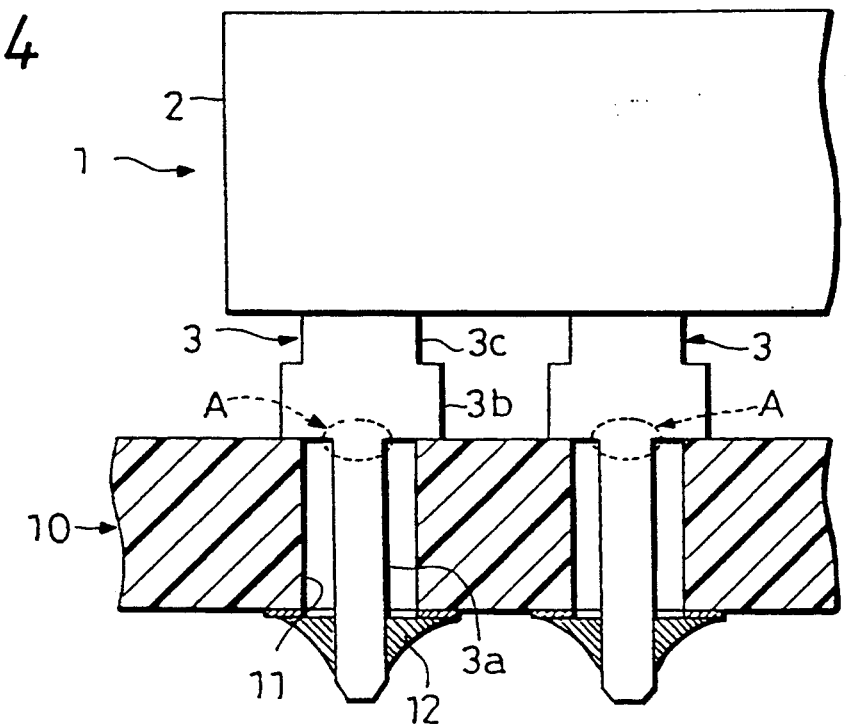
FIG. 4 is a sectional view showing the lead terminals of a conventional electronic circuit component.

In the typical embodiment of the invention shown in FIG. 1, an electronic circuit component 1 has two lead terminals 3. The parts shown in FIG. 1 which correspond to those shown in FIG. 4 are denoted by the same reference symbols and are not described in detail hereinafter. Each of the lead terminals 3 of the component 1 includes a tapered portion 3d formed at the boundary between the inserted tip portion 3a and the cut dumb bar portion 3b of the terminal and having a width which decreases from the bar portion toward the tip portion. When a printed circuit board 10 is vibrated after the component 1 has been mounted thereon by soldering, the component is also vibrated so that the lead terminal 3 undergoes stress. However, since the terminal 3 has the tapered portion 3d at the boundary between the inserted tip portion 3a and the cut dumb bar portion 3b so as to avoid any sharp change in the width of the terminal, stresses are prevented from concentrating at any point in the terminal.

Since the width of the tip portion 3a is the same as that of the tip portion of the lead terminal of the conventional component, the component 1 having terminals according to the invention can be mounted on the board 10 using an insertion machine without altering the grabbing mechanism of the machine which is designed to automatically mount conventional components on the board.

Figure 2:
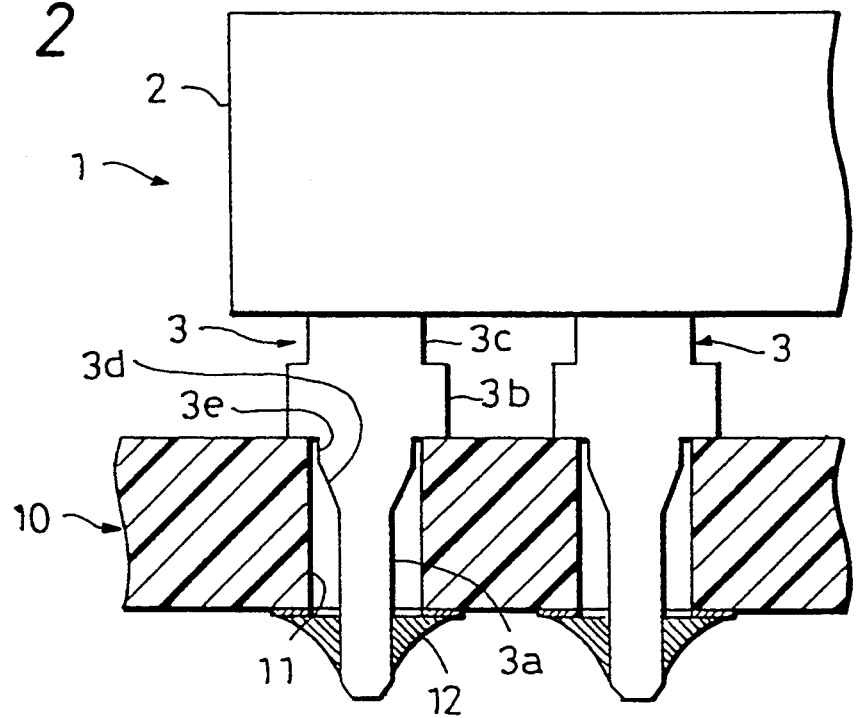
FIG. 2 is a sectional view showing a modification of the embodiment illustrated in FIG. 1.

FIG. 2 shows an electronic circuit component 1 which is a modification of the first embodiment. Although the tapered portion 3d in this embodiment is located immediately below the cut dumb bar portion 3b, as in the first embodiment, the lead terminals 3 of this component 1 include a straight portion 3e, which is located immediately below a cut dumb bar portion 3b and has a width slightly larger than that of an inserted tip portion 3a, along with a tapered portion 3d located immediately below the straight portion as seen in the drawing. The component 1 of this embodiment provides the same improvement as discussed with respect to the component shown in FIG. 1.

Figure 3:
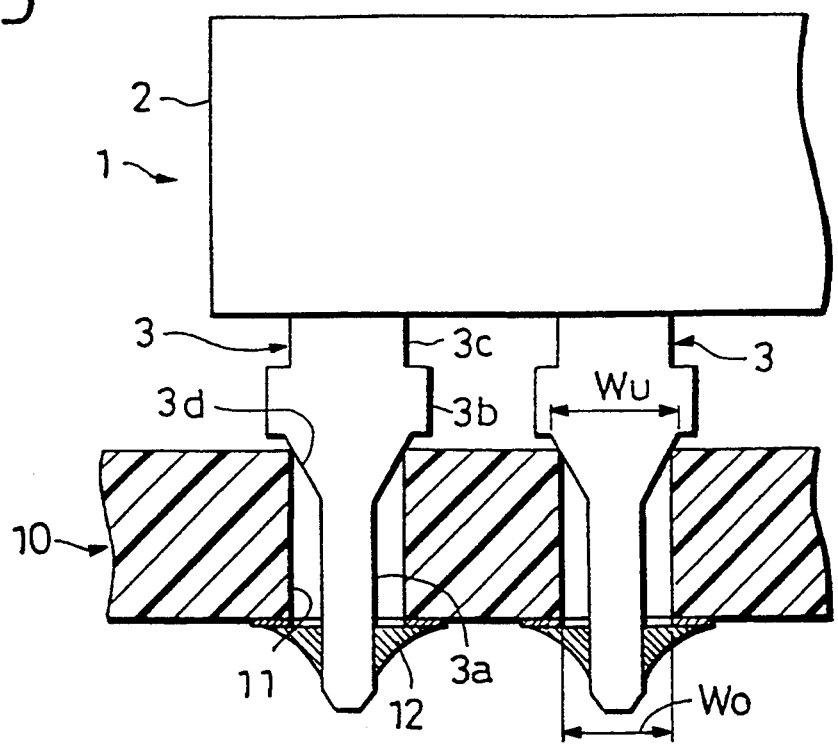
FIG. 3 is a sectional view illustrating the lead terminals of an electronic circuit component which is another representative embodiment of the invention.

FIG. 3 shows another embodiment of an electronic circuit component 1 according to the invention. In this case, the component 1 has a tapered portion 3d formed at the boundary between an inserted tip portion 3a and a cut dumb bar portion 3b with a width at the upper end which is larger than the diameter $W_0$ of the lead terminal hole 11 of a printed circuit board 10 on which the component is to be mounted. Consequently, when the component 1 is mounted on the board 10, the intermediate part of the tapered portion 3d cuts into the edge of the board around the lead terminal hole 11 so as to be firmly engaged with the edge so that the component is rigidly fixed to the board. For that reason, the component 1 is prevented from tilting on the board when it is subjected to a flow-soldering process. Since the component 1 is fixedly supported on the board 10 at the soldered tip portions 3a under the board and at the tapered portions 3d, the vibration of the component is reduced when the board is vibrated so that the stress to which each terminal 3 is subjected by the vibration is diminished. Moreover, because the tapered portion 3d avoids any sharp change in width in the terminal 3, stresses are prevented from concentrating therein in the same manner as in the first embodiment.

The present invention is not confined to electronic circuit components such as semiconductor devices, including transistors and integrated circuits, but also includes other electronic circuit components having lead terminals which are inserted into the lead terminal holes of circuit boards and are connected thereto by soldering.

As described above, the lead terminals of an electronic circuit component arranged in accordance with the present invention have a tapered portion between the inserted tip portion and the cut dumb bar portion so as to avoid sharp changes in the lead terminal width. For that reason, the stress which the terminal undergoes during vibration of a circuit board with the component mounted thereon is prevented from concentrating in the terminal to bend or break it.

Lead terminals for an electronic circuit component may also be arranged in accordance with the present invention with a tapered portion which is formed between the inserted tip portion and the cut dumb bar portion, having an intermediate part engaged with the edge of a circuit board around the lead terminal hole thereof to rigidly support the component on the board so that the component is prevented from tilting while being soldered to the board, and so that vibration of the component mounted on the board is reduced to diminish the stress which the terminal undergoes during vibration. Furthermore, the tapered portion serves to avoid sharp changes in the width of the lead terminal. For these reasons, the terminal is more effectively prevented from being bent or broken.

Although the invention has been described herein with reference to specific embodiments, many modifications and variations therein will readily occur to those skilled in the art. Accordingly, all such variations and modifications are included within the intended scope of the invention.

I claim:

1. An electronic circuit component arranged for mounting on a circuit board having lead terminal holes comprising a component member and a plurality of lead terminals in the form of strips of flat sheet material projecting from the component member, each of which includes a tip portion for insertion into a circular lead terminal hole of a circuit board, a cut dumb bar portion formed by cutting out a dumb bar coupling adjacent terminals together and having a width larger than the diameter of the circuit board terminal hole, the cut dumb bar portions of the plurality of lead terminals uniformly engaging the upper surface of the circuit board to hold the component member in spaced relation thereto, a butt portion having a width larger than the tip portion located between the cut dumb bar portion and the component member, and a tapered portion between the tip portion and the cut dumb bar portion and having a width which decreases from the cut dumb bar portion toward the tip portion.

2. The electronic circuit component according to claim 1 wherein the width of the tapered portion at the end thereof adjacent to the cut dumb bar portion is larger than the diameter of a lead terminal hole for receiving the terminal.

3. A method for mounting an electronic circuit component having lead terminals in the form of strips of flat sheet material on a circuit board having terminal holes comprising providing an electronic circuit component with projecting terminals, each of which includes a tip portion for insertion into a circular lead terminal hole of the circuit board, a cut dumb bar portion formed by cutting out a dumb bar coupling adjacent terminals together and having a width larger than the diameter of the lead terminal hole, the cut dumb bar portions of the plurality of lead terminals uniformly engaging the upper surface of the circuit board to hold the component member in spaced relation thereto, and a butt portion larger in width than the tip portion located between the cut dumb bar portion and the component member, said method comprising the steps of: inserting the lead terminals into corresponding lead terminal holes in the circuit board and engaging the tapered portions of the terminals formed between the tip portion and the cut dumb bar portion with the edge of the circuit board around the lead terminal holes so that the component is rigidly mounted on the circuit board.

* * * * *